(12) United States Patent
Zhang et al.

(10) Patent No.: US 10,002,889 B2
(45) Date of Patent: Jun. 19, 2018

(54) LOW-TEMPERATURE POLYSILICON THIN FILM TRANSISTOR ARRAY SUBSTRATE AND METHOD OF FABRICATING THE SAME, AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Jiaxiang Zhang, Beijing (CN); Xiaohui Jiang, Beijing (CN); Changjiang Yan, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days. days.

(21) Appl. No.: 14/443,777

(22) PCT Filed: Oct. 28, 2014

(86) PCT No.: PCT/CN2014/089661
§ 371 (c)(1),
(2) Date: May 19, 2015

(87) PCT Pub. No.: WO2016/000363
PCT Pub. Date: Jan. 7, 2016

(65) Prior Publication Data
US 2016/0254290 A1 Sep. 1, 2016

(30) Foreign Application Priority Data
Jun. 30, 2014 (CN) .......................... 2014 1 0305957

(51) Int. Cl.
| | | |
|---|---|---|
| *H01L 27/12* | (2006.01) | |
| *H01L 29/786* | (2006.01) | |
| *H01L 29/423* | (2006.01) | |
| *H01L 29/417* | (2006.01) | |
| *H01L 21/77* | (2017.01) | |

(52) U.S. Cl.
CPC .......... *H01L 27/1248* (2013.01); *H01L 21/77* (2013.01); *H01L 27/12* (2013.01);
(Continued)

(58) Field of Classification Search
CPC ............. H01L 27/1248; H01L 27/1262; H01L 27/1274; H01L 27/1222
See application file for complete search history.

(56) References Cited

U.S. PATENT DOCUMENTS 5,650,636 A * 7/1997 Takemura ........... G02F 1/13624
257/532
2003/0047733 A1* 3/2003 Takemura ........... G02F 1/13624
257/59

(Continued)

FOREIGN PATENT DOCUMENTS

| CN | 1567422 A | 1/2005 |
|---|---|---|
| CN | 1637546 A | 7/2005 |

(Continued)

OTHER PUBLICATIONS

Office Action for CN 201410305957.7 and English translation thereof dated May 16, 2016.

(Continued)

*Primary Examiner* — Hoang-Quan Ho
(74) *Attorney, Agent, or Firm* — Nath, Goldberg & Meyer; Joshua B. Goldberg

(57) ABSTRACT

The present invention provides a low-temperature polysilicon thin film transistor array substrate and a method of fabricating the same, and a display device. The array substrate comprises: a substrate; a polysilicon active layer (Continued)

provided on the substrate; a first insulation layer provided on the active layer; a plurality of gates and a gate line provided on the first insulation layer; a second insulation layer provided on the gates; a source, a drain, a data line and a pixel electrode electrically connected with the drain, which are provided on the second insulation layer, the source covers the plurality of gates. The plurality of gates are provided directly below the source, so that the leakage current is reduced and the aperture ratio of panel is improved.

15 Claims, 8 Drawing Sheets

(52) U.S. Cl.
CPC ...... *H01L 27/1222* (2013.01); *H01L 27/1262* (2013.01); *H01L 27/1274* (2013.01); *H01L 29/41733* (2013.01); *H01L 29/42384* (2013.01); *H01L 29/78633* (2013.01); *H01L 29/78645* (2013.01)

(56) References Cited

U.S. PATENT DOCUMENTS

| | | | |
|---|---|---|---|
| 2004/0239825 A1 | 12/2004 | Koide et al. | |
| 2006/0132011 A1* | 6/2006 | Shimizu | C09K 11/06 313/112 |
| 2007/0159565 A1 | 7/2007 | Segawa et al. | |
| 2009/0057669 A1 | 3/2009 | Ishii | |
| 2009/0279028 A1* | 11/2009 | Chen | G02F 1/133555 349/114 |
| 2010/0231493 A1* | 9/2010 | Kaise | G02F 1/136213 345/87 |
| 2011/0114971 A1* | 5/2011 | Sato | H01L 27/1218 257/88 |
| 2011/0254008 A1* | 10/2011 | Suzawa | H01L 21/32136 257/59 |
| 2012/0188212 A1 | 7/2012 | Ina et al. | |
| 2012/0193624 A1* | 8/2012 | You | H01L 27/124 257/57 |
| 2015/0187307 A1* | 7/2015 | Jin | G09G 3/3648 257/72 |

FOREIGN PATENT DOCUMENTS

| | | |
|---|---|---|
| CN | 102576162 A | 7/2012 |
| CN | 204029807 U | 12/2014 |
| JP | 3428321 B2 | 7/2003 |

OTHER PUBLICATIONS

Second Office Action dated Jan. 13, 2017 in corresponding Chinese Application No. 201410305957.7.
Search Report dated Jan. 29, 2018 issued in corresponding European Application No. 14861140.3.

* cited by examiner

LOW-TEMPERATURE POLYSILICON THIN FILM TRANSISTOR ARRAY SUBSTRATE AND METHOD OF FABRICATING THE SAME, AND DISPLAY DEVICE

This is a National Phase Application filed under 35 U.S.C. 371 as a national stage of PCT/CN2014/089661, filed Oct. 28, 2014, an application claiming the benefit of Chinese Application No. 201410305957.7, filed Jun. 30, 2014, the content of each of which is hereby incorporated by reference in its entirety.

FIELD OF THE INVENTION

The present invention relates to the field of display technology, and in particular, relates to an array substrate and a method of fabricating the same, and a display device.

BACKGROUND OF THE INVENTION

Amorphous silicon (α-Si) technology and low-temperature polysilicon (LTPS) technology are widely used in the field of display technology. With the development of display technology, the LTPS technology is increasingly widely used due to the advantages of high efficient and high definition.

A magnitude of leakage current is an important parameter for the LTPS structure. The high magnitude of leakage current may cause a driving voltage to be unable to maintain at a certain level and may result in undesirable display performance. A dual-gate or multi-gate structure is currently used as a method for reducing the leakage current of the LTPS structure, for example, the dual-gate structure including two gates 7 shown in FIG. 1 is used. Although an electric field distribution in a channel may be effectively reduced by using the plurality of gates so that hot carrier effect is reduced and the leakage current is restrained, the gate 7 is generally made of metal material with good electrical conductivity, e.g., molybdenum or molybdenum aluminum alloy, and the material (i.e., the gate 7 in FIG. 1) itself is opaque and will block the light. Therefore, the technical solution of utilizing the structure of dual-gate or multi-gate in the prior art goes against improvement of display aperture ratio.

SUMMARY OF THE INVENTION

The embodiments of the present invention provide a low-temperature polysilicon thin film transistor array substrate and a method of fabricating the same, and a display device, which reduces the leakage current and improves the aperture ratio of panel.

The embodiment of the present invention provides a low-temperature polysilicon thin film transistor array substrate, comprising: a substrate; a polysilicon active layer provided on the substrate; a first insulation layer provided on the active layer; a plurality of gates and a gate line provided on the first insulation layer; a second insulation layer provided on the gates; a source, a drain, a data line and a pixel electrode electrically connected with the drain, which are provided on the second insulation layer, the source covers the plurality of gates.

The array substrate may further comprise a buffer layer provided below the active layer.

The number of the plurality of gates in the array substrate may be two to five.

The array substrate may further comprise a common electrode provided in the same layer as the pixel electrode.

Alternatively, the array substrate may further comprise a third insulation layer provided above the pixel electrode and a slit-shaped common electrode provided on the third insulation layer.

Alternatively, the array substrate may further comprise a common electrode provided in the same layer as the gate.

The second insulation layer of the array substrate may comprise resin material.

The resin material may include polymethyl methacrylate and photosensitive agent.

A thickness of the second insulation layer may range from 1.5 μm to 2.0 μm.

Another embodiment of the present invention provides a method of fabricating a low-temperature polysilicon thin film transistor array substrate, comprising steps of: sequentially forming an active layer, a first insulation layer and a plurality of gates on a base substrate; forming a second insulation layer comprising a first via and a second via on the substrate on which the active layer, the first insulation layer and the gates are formed; forming a pattern comprising a source and a drain on the substrate on which the second insulation layer is formed, the source covering the plurality of gates; and forming a pattern comprising a pixel electrode on the substrate on which the pattern comprising the source and the drain is formed, the pixel electrode being connected with the drain.

The step of sequentially forming an active layer, a first insulation layer and a plurality of gates on a base substrate comprises: depositing a buffer layer and an amorphous silicon thin film on the substrate, converting the amorphous silicon into low-temperature polysilicon, and forming a pattern comprising the active layer by a patterning process; forming a pattern of the first insulation layer on the substrate on which the active layer is formed; and depositing a gate metal thin film on the substrate on which the first insulation layer is formed, and forming a pattern comprising the plurality of gates by a patterning process.

The method of fabricating the low-temperature polysilicon thin film transistor array substrate may further comprise steps of: forming a third insulation layer on the substrate on which the pattern of the pixel electrode is formed; and depositing a transparent conductive thin film on the substrate on which the third insulation layer is formed, and forming a pattern comprising a common electrode by a patterning process.

Alternatively, the method of fabricating the low-temperature polysilicon thin film transistor array substrate may further comprise a step of forming a pattern of a common electrode while forming the pattern of the plurality of gates.

The second insulation layer is a resin layer formed by spin coating.

Yet another embodiment of the present invention provides a display device comprising the above low-temperature polysilicon thin film transistor array substrate.

In the array substrate according to the embodiment of the present invention, the multi-gate structure is provided directly below the source, so that the aperture ratio of panel is improved and the leakage current is reduced. In addition, the resin layer with low dielectric constant is provided between the gate and the source and drain, so that the coupling capacitance generated by the gate and the source overlapped with each other is avoided, thereby reducing the leakage current.

DESCRIPTION OF THE PREFERRED EMBODIMENT

To make those skilled in the art better understand the technical solutions of the present invention, an array substrate and a method of fabricating the same, and a display device according to the present invention will be described in detail below in conjunction with the accompanying drawings.

First Embodiment

Figure 1:
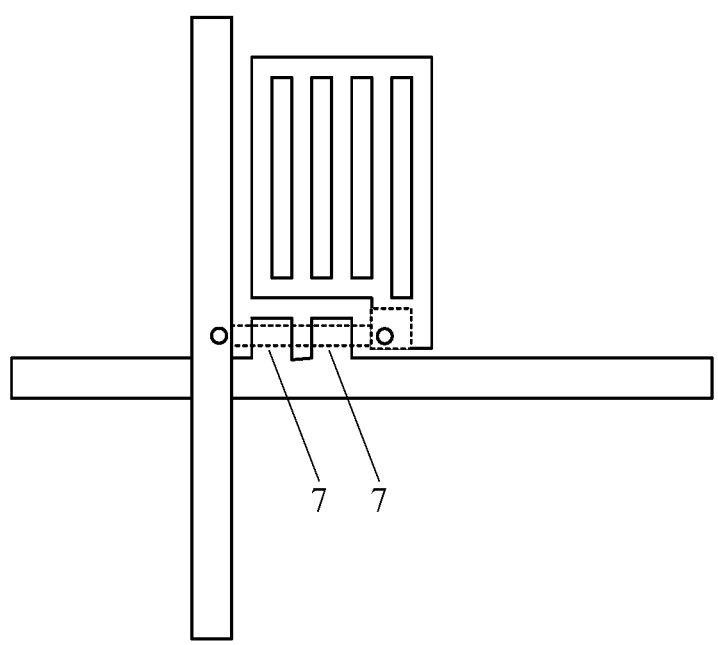
FIG. 1 is a plan view of an array substrate of dual-gate structure in prior art.
Figure 2A:
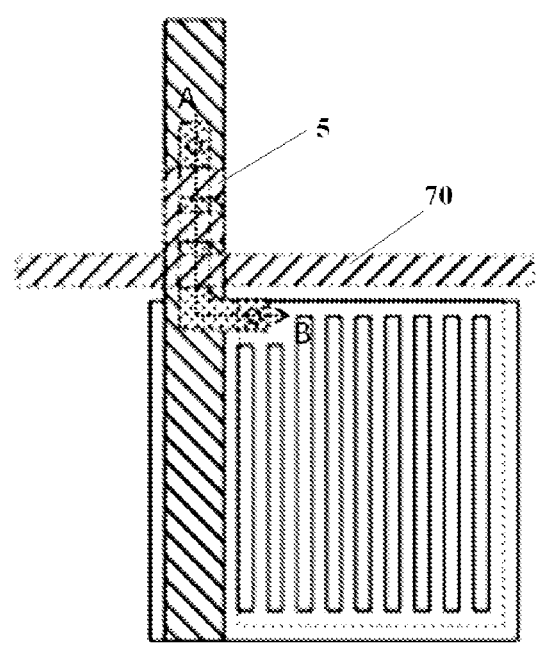
FIG. 2A is a plan view of an array substrate in a first embodiment of the present invention.
Figure 2B:
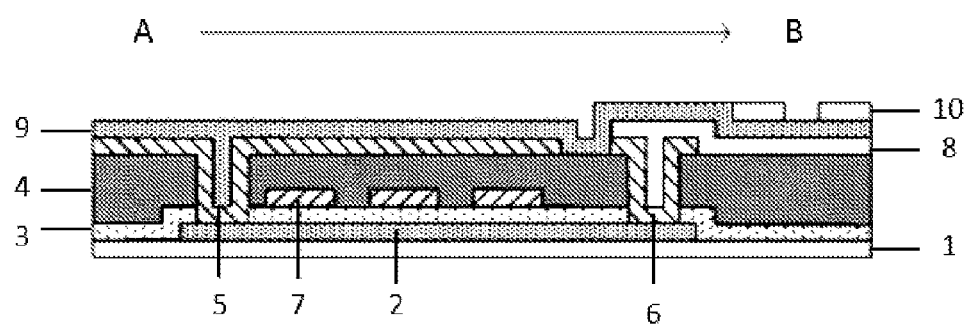
FIG. 2B is a cross-sectional view taken along a line A-B in FIG. 2A.

The first embodiment provides a low-temperature polysilicon thin film transistor array substrate. Referring to FIGS. 2A and 2B, FIG. 2A is a plan view of the array substrate of the first embodiment, and FIG. 2B is a cross-sectional view taken along a line A-B in FIG. 2A. The array substrate of the first embodiment comprises: a substrate 1; a polysilicon active layer 2 provided on the substrate 1; a first insulation layer 3 provided on the active layer 2; a plurality of gates 7 and a gate line 70 provided on the first insulation layer 3; a second insulation layer 4 provided on the gate 7; a source 5, a drain 6, a data line and a pixel electrode 8 electrically connected with the drain 6, which are provided on the second insulation layer 4, the source 5 covering the plurality of gates 7.

As shown in FIG. 2B, the number of the plurality of gates is three. Referring to FIGS. 2A and 2B, the multi-gate structure is provided directly below the source 5, and the plurality of gates 7 are covered by the source 5 in the plan view of the array substrate. Compared with the array substrate in the prior art in which the plurality of gates not covered by the source in the plan view additionally block the light, in the array substrate of the embodiment, light blocking by the metal is reduced by providing the plurality of gates directly below the source, so that the aperture ratio of panel is improved.

Referring to FIG. 2B, the array substrate of the embodiment further comprises a third insulation layer 9 provided on the pixel electrode 8 and a slit-shaped common electrode 10 provided on the third insulation layer 9.

The pixel electrode 8 and the common electrode 10 are both made of at least one of indium gallium zinc oxide, indium zinc oxide (IZO), indium tin oxide (ITO) and indium gallium tin oxide.

The first insulation layer 3, the second insulation layer 4 and the third insulation layer 9 may be made of at least one of silicon oxide, silicon nitride, hafnium oxide and aluminum oxide. The gate 7, the source 5 and the drain 6 may be made of at least one of molybdenum, molybdenum niobium alloy, aluminum, aluminum neodymium alloy, titanium and copper. The active layer 2 may be made of low-temperature polysilicon material.

Alternatively, in the array substrate of the embodiment, the number of the plurality of gates 7 may be two. Of course, the person skilled in the art may utilize four or five gates according to the requirement.

In the low-temperature polysilicon thin film transistor array substrate according to the embodiment, a buffer layer may further be provided below the active layer 2.

Alternatively, in the array substrate of the embodiment, the common electrode and the pixel electrode may be provided in the same layer, so as to form a structure of in-plane switching (IPS). In addition, the common electrode may also be provided in the same layer as the gate.

Alternatively, in the array substrate of the embodiment, the second insulation layer 4 may comprise resin material. The resin material may include polymethyl methacrylate and photosensitive agent. A thickness of the second insulation layer 4 ranges from 1.5 μm to 2.0 μm.

Second Embodiment

The second embodiment provides a method of fabricating a low-temperature polysilicon thin film transistor array substrate. Before description of the fabricating method, it should be understood that the patterning process in the present invention may comprise only a photolithography process, or comprise a photolithography process and etching process, and may further comprise other process for forming predetermined patterns, e.g., printing, ink jetting, etc. The photolithography process refers to a process for forming patterns, which comprises processing procedures such as film coating, exposure and development and utilizes photoresists, mask plates, an exposure machine and so on. The patterning process may be selected according to the corresponding structure to be formed in the present invention.

The method of fabricating the low-temperature polysilicon thin film transistor array substrate according to the second embodiment comprises steps S1 through S8 as follows.

In step S1, an amorphous silicon thin film is deposited on a substrate, then the amorphous silicon is converted into low-temperature polysilicon, and a pattern comprising an active layer 2 is formed by a patterning process.

Figure 3A:
FIG. 3A is a plan view of structures formed in a first patterning process in a method of fabricating an array substrate in a second embodiment of the present invention.
Figure 3B:
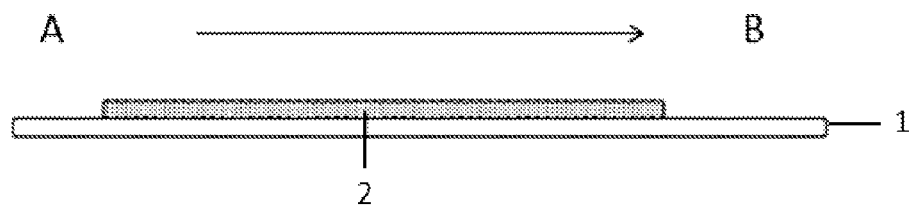
FIG. 3B is a cross-sectional view taken along a line A-B in FIG. 3A.

In this step, as shown in FIGS. 3A and 3B, the amorphous silicon layer is deposited on the substrate 1 by chemical vapor deposition (CVD) process. For example, the amorphous silicon is crystallized into the low-temperature polysilicon by use of excimer laser annealing (ELA) process. The steps of photolithography and etching are then performed to form the desired patterned low-temperature polysilicon layer.

In step S2, a pattern of first insulation layer 3 is formed on the substrate subjected to step S1.

Figure 4A:
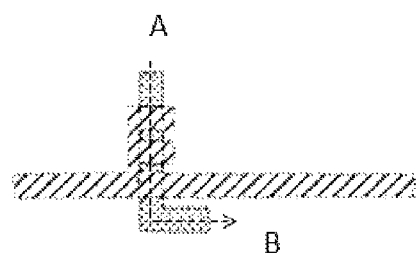
FIG. 4A is a plan view of structures formed in a second patterning process in a method of fabricating an array substrate in a second embodiment of the present invention.
Figure 4B:
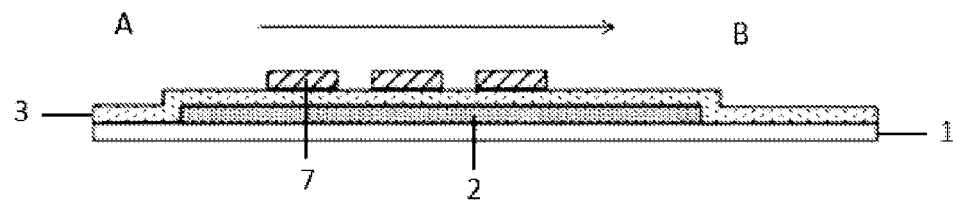
FIG. 4B is a cross-sectional view taken along a line A-B in FIG. 4A.

In this step, as shown in FIGS. 4A and 4B, the first insulation layer 3 is formed on the substrate 1 subjected to step S1 by use of chemical vapor deposition (CVD) process, a thickness of the first insulation layer 3 ranges from 1000 Å to 6000 Å. The first insulation layer 3 is generally formed by using transparent material (silicon oxide, silicon nitride, hafnium oxide or aluminum oxide).

In step S3, a gate metal thin film is deposited on the substrate subjected to step S2, and a pattern comprising gates 7 and a gate line is formed by a patterning process.

In this step, as shown in FIGS. 4A and 4B, the gate metal thin film is formed on the substrate 1 subjected to step S2, the gate metal thin film may be formed by using at least one of molybdenum, molybdenum niobium alloy, aluminum, aluminum neodymium alloy, titanium and copper, and then the pattern comprising the gates 7 and the gate line is formed by a patterning process, the gates 7 are connected with the gate line. Doping is performed on the active layer by using gates 7 as mask layer. The gates are formed as a three-gate pattern or multi-gate pattern and has a comb-shaped distribution, the multi-gate structure is provided directly below the source.

The gate metal thin film may be formed by using deposition process, sputtering process or thermal evaporation process, a thickness of the gate metal thin film ranges from 1000 Å to 7000 Å. In the patterning process, a layer of photoresist is first coated on the gate metal thin film, and then exposure, development, etching and stripping are performed on the photoresist by using a mask plate, so as to form the pattern comprising the gates 7 and the gate line.

The multi-gate structure is provided directly below the source, so that the leakage current is reduced and the aperture ratio of panel is improved.

In step S4, a layer of resin layer with a thickness about 3 μm is spin-coated on the substrate subjected to step S3, so as to form a second insulation layer 4. Via holes are formed in the first insulation layer 3 and the second insulation layer 4 by a patterning process.

Figure 5A:
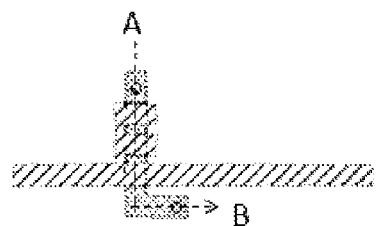
FIG. 5A is a plan view of structures formed in a third patterning process in a method of fabricating an array substrate in a second embodiment of the present invention.
Figure 5B:
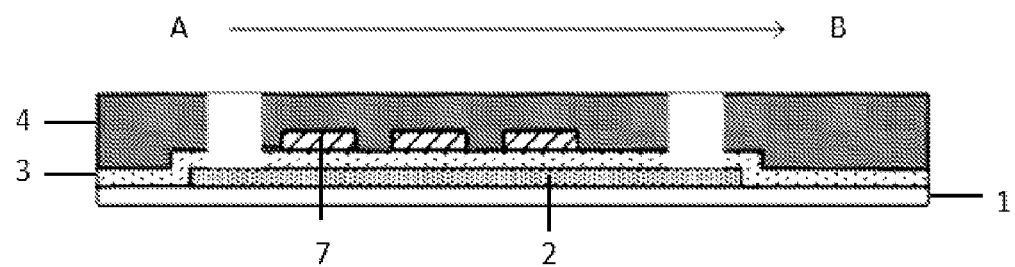
FIG. 5B is a cross-sectional view taken along a line A-B in FIG. 5A.

In this step, as shown in FIGS. 5A and 5B, a layer of resin layer is coated on the substrate 1 subjected to step S3 by a spin coating process, so as to form the second insulation layer 4. The via holes are formed in the first insulation layer 3 and the second insulation layer 4 by a patterning process.

The resin layer with low dielectric constant is provided between the gate 7 and the source and drain, so as to avoid that a coupling capacitance is formed by the gate and the source overlapped with each other.

In step S5, a source and drain metal thin film is deposited on the substrate subjected to step S4, and a pattern comprising a source 5 and a drain 6 is formed by a patterning process.

Figure 6A:
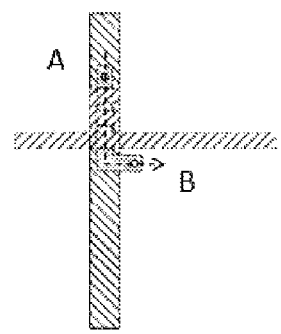
FIG. 6A is a plan view of structures formed in a fourth patterning process in a method of fabricating an array substrate in a second embodiment of the present invention.
Figure 6B:
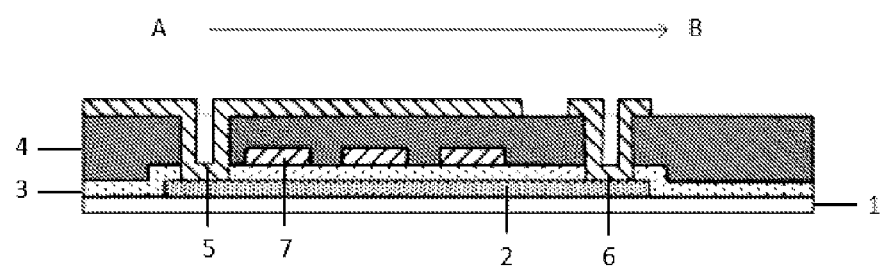
FIG. 6B is a cross-sectional view taken along a line A-B in FIG. 6A.

In this step, as shown in FIGS. 6A and 6B, the source and drain metal thin film is formed on the substrate 1 subjected to step S4, and the pattern comprising the source 5, the drain 6 and a data line is formed by a patterning process. The source 5 and the drain 6 are provided above and at both sides of the second insulation layer 4 and are connected with a doped region of the active layer 2 through the via holes provided in the second insulation layer 4 and the first insulation layer 3, respectively.

The source and drain metal thin film may be formed by using deposition process, sputtering process or thermal evaporation process. In the patterning process, a layer of photoresist is first coated on the source and drain metal thin film, and then exposure, development, etching and stripping are performed on the photoresist by using a mask plate, so as to form the pattern comprising the source 5, the drain 6 and the data line. The source and drain metal thin film may be formed by using at least one of molybdenum, molybdenum niobium alloy, aluminum, aluminum neodymium alloy, titanium and copper.

In step S6, a transparent conductive thin film is deposited on the substrate subjected to step S5, and a pattern comprising a pixel electrode 8 is formed by a patterning process, the pixel electrode 8 is electrically connected with the drain 6.

Figure 7A:
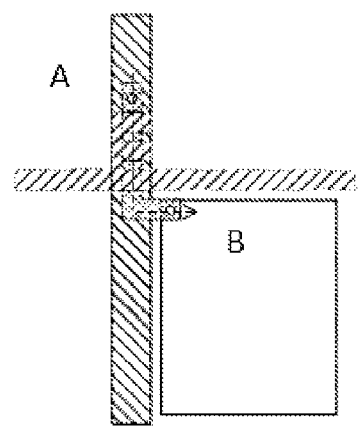
FIG. 7A is a plan view of structures formed in a fifth patterning process in a method of fabricating an array substrate in a second embodiment of the present invention.
Figure 7B:
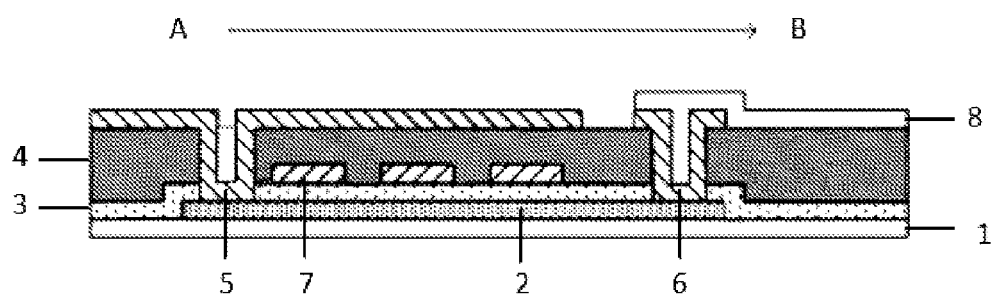
FIG. 7B is a cross-sectional view taken along a line A-B in FIG. 7A.

In this step, as shown in FIGS. 7A and 7B, the pixel electrode film is formed on the substrate subjected to step S5, and the pattern comprising the pixel electrode 8 is formed by a patterning process. The pixel electrode 8 is provided above the drain 6 and the second insulation layer 4, and the pixel electrode 8 is electrically connected with the drain 6.

The pixel electrode thin film may be formed by using deposition process, sputtering process or thermal evaporation process, a thickness of the pixel electrode thin film ranges from 100 Å to 1000 Å. In the patterning process, a layer of photoresist is first coated on the pixel electrode thin film, and exposure, development, etching and stripping are performed on the photoresist by using a mask plate, so as to form the pattern comprising the pixel electrode 8.

In step S7, a third insulation layer 9 is deposited on the substrate subjected to step S6, and via holes are formed by a patterning process.

Figure 8A:
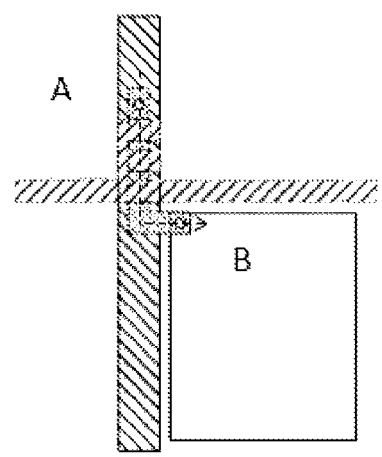
FIG. 8A is a plan view of structures formed in a sixth patterning process in a method of fabricating an array substrate in a second embodiment of the present invention.
Figure 8B:
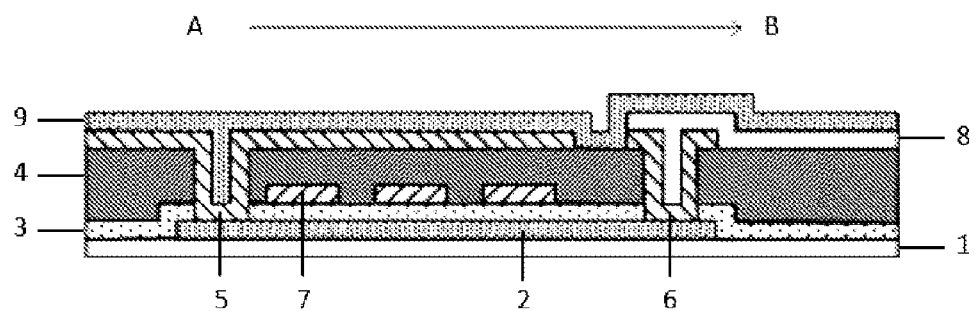
FIG. 8B is a cross-sectional view taken along a line A-B in FIG. 8A.

In this step, as shown in FIGS. 8A and 8B, a passivation layer thin film is formed on the substrate 1 subjected to step S6, and the pattern of the third insulation layer 9 (PVX) is formed by a patterning process, the pattern of the third insulation layer 9 covers the source 5, the drain 6 and the pixel electrode 8.

The passivation layer thin film may be formed by using deposition process, sputtering process or thermal evaporation process, a thickness of the passivation layer thin film ranges from 1000 Å to 6000 Å. In the patterning process, a layer of photoresist is first coated on the passivation layer thin film, and exposure, development, etching and stripping are performed on the photoresist by using a mask plate, so as to form the pattern comprising the third insulation layer 9 and the via hole. Similar to the first insulation layer 3, the third insulation layer 9 is generally formed by using transparent material (silicon oxide, silicon nitride, hafnium oxide or aluminum oxide).

Here, the third insulation layer 9 is formed above the data line, the source 5 and the drain 6 and extends to a peripheral lead wire region of the array substrate. A data line driving signal introducing electrode is provided at the peripheral lead wire region of the array substrate. The via hole is provided at the position of the third insulation layer 9 corresponding to the data line driving signal introducing electrode, and the data line is electrically connected with the data line driving signal introducing electrode through the via hole.

In step S8, a transparent conductive thin film is deposited on the substrate subjected to step S7, and a pattern comprising a common electrode 10 is formed by a patterning process.

Figure 9A:
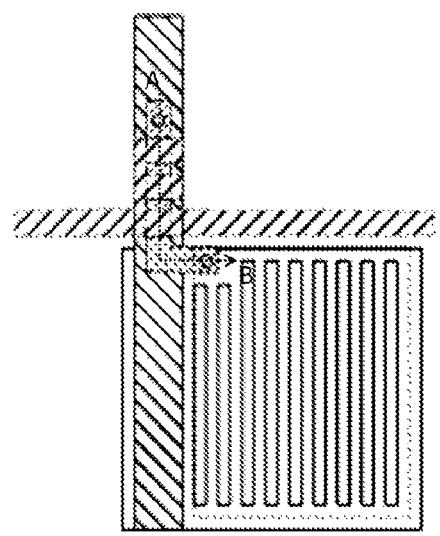
FIG. 9A is a plan view of structures formed in a seventh patterning process in a method of fabricating an array substrate in a second embodiment of the present invention.
Figure 9B:
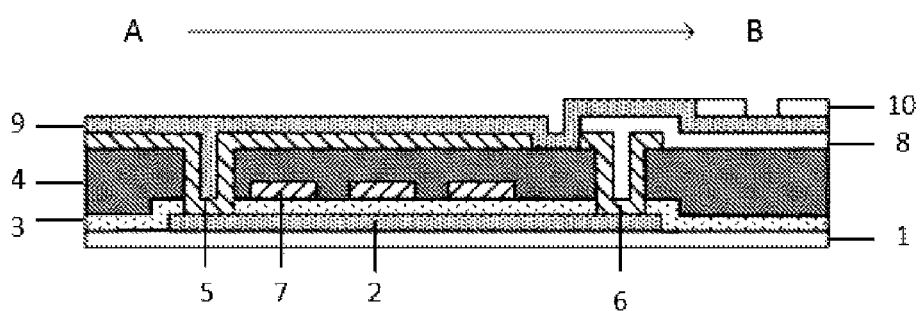
FIG. 9B is a cross-sectional view taken along a line A-B in FIG. 9A.

In this step, as shown in FIGS. 9A and 9B, the common electrode thin film is formed on the substrate 1 subjected to step S7, and the pattern comprising the common electrode 10 is formed on the third insulation layer 9 by a patterning process.

The common electrode thin film may be formed by using deposition process, sputtering process or thermal evaporation process. In the patterning process, a layer of photoresist is first coated on the common electrode thin film, and exposure, development, etching and stripping are performed on the photoresist by using a mask plate, so as to form the pattern comprising the common electrode 10. The common electrode 10 is a slit electrode having a comb-shaped distribution.

In the above method of fabricating the array substrate, the number of the patterning processes may be reduced by using half tone or gray tone mask plate, and the embodiment is not limited thereto.

In the method of fabricating the array substrate in the embodiment, the plurality of gates are formed directly below the source, so that the leakage current is reduced and the aperture ratio of panel is improved. In addition, the resin layer with low dielectric constant is formed between the gate and the source and drain, so that the coupling capacitance to be generated by the gate and the source overlapped with each other is avoided.

The embodiments of the present invention further provide a display device that comprises any one of the above array substrates. The display device may be applied to any product or component with display function, such as LCD panel, electronic paper, OLED panel, mobile phone, tablet computer, television, monitor, notebook computer, digital picture frame, navigation, etc.

It could be understood that, the above implementation ways are merely exemplary embodiments adopted for describing the principle of the present invention, but the present invention is not limited thereto. Various modifications and improvements may be made by those of ordinary skill in the art without departing from the spirit and essence of the present invention, and these modifications and improvements are contemplated as within the protection scope of the present invention.

The invention claimed is:

1. A low-temperature polysilicon thin film transistor array substrate, comprising:
   a substrate;
   a polysilicon active layer provided on the substrate;
   a first insulation layer provided on the active layer;
   a plurality of gates and a gate line provided on the first insulation layer, wherein a plurality of gates are formed to have a comb-shaped distribution;
   a second insulation layer provided on the plurality of gates;
   a source, a drain, a data line and a pixel electrode provided on the second insulation layer, wherein the pixel electrode is electronically connected with the drain,
   wherein the source covers the plurality of gates having the comb-shaped distribution, and a portion of the source covering the plurality of gates is provided on only a substantially flat upper surface of the second insulation layer.

2. The array substrate of claim 1, further comprising a buffer layer provided below the active layer.

3. The array substrate of claim 1, wherein the number of the plurality of gates is two to five.

4. The array substrate of claim 1, further comprising:
   a third insulation layer provided on the pixel electrode; and
   a slit-shaped common electrode provided on the third insulation layer.

5. The array substrate of claim 1, wherein the second insulation layer comprises resin material.

6. The array substrate of claim 5, wherein the resin material includes polymethyl methacrylate and photosensitive agent.

7. The array substrate of claim 5, wherein a thickness of the second insulation layer ranges from 1.5 μm to 2.0 μm.

8. A method of fabricating a low-temperature polysilicon thin film transistor array substrate, comprising steps of:
   sequentially forming a polysilicon active layer, a first insulation layer and a plurality of gates on a base substrate, wherein the plurality of gates are formed to have a comb-shaped distribution;
   forming a second insulation layer comprising a first via and a second via on the substrate on which the active layer, the first insulation layer and the plurality of gates are formed;
   forming a pattern comprising a source and a drain on the substrate on which the second insulation layer is formed, the source covering the plurality of gates having the comb-shaped distribution, and a portion of the source covering the plurality of gates being formed on only a substantially flat upper surface of the second insulation layer; and
   forming a pattern comprising a pixel electrode on the substrate on which the pattern comprising the source and the drain is formed, the pixel electrode being connected with the drain.

9. The method of claim 8, wherein the step of sequentially forming an active layer, a first insulation layer and a plurality of gates on a base substrate comprises:
   depositing a buffer layer and an amorphous silicon thin film on the substrate, converting the amorphous silicon into low-temperature polysilicon, and forming a pattern comprising the active layer by a patterning process;
   forming a pattern of the first insulation layer on the substrate on which the active layer is formed; and
   depositing a gate metal thin film on the substrate on which the first insulation layer is formed, and forming a pattern comprising the plurality of gates by a patterning process.

10. The method of claim 8, further comprising steps of:
    forming a third insulation layer on the substrate on which the pattern of the pixel electrode is formed; and
    depositing a transparent conductive thin film on the substrate on which the third insulation layer is formed, and forming a pattern comprising a common electrode by a patterning process.

11. The method of claim 8, wherein the second insulation layer is a resin layer formed by spin coating.

12. A display device, comprising a low-temperature polysilicon thin film transistor array substrate, the array substrate comprising:
    a substrate;
    a polysilicon active layer provided on the substrate;
    a first insulation layer provided on the active layer;
    a plurality of gates and a gate line provided on the first insulation layer, wherein the plurality of gates are formed to have a comb-shaped distribution;

a second insulation layer provided on the plurality of gates;

a source, a drain, a data line and a pixel electrode provided on the second insulation layer, wherein the pixel electrode is electrically connected with the drain, wherein the source covers the plurality of gates having the comb-shaped distribution, and a portion of the source covering the plurality of gates is provided on only a substantially flat upper surface of the second insulation layer.

13. The display device of claim 12, further comprising:

a third insulation layer provided on the pixel electrode; and a slit-shaped common electrode provided on the third insulation layer.

14. The display device of claim 12, wherein the second insulation layer comprises resin material.

15. The display device of claim 14, wherein the resin material includes polymethyl methacrylate and photosensitive agent.

* * * * *